United States Patent [19]

Dietrich et al.

[11] Patent Number: 4,548,691

[45] Date of Patent: Oct. 22, 1985

[54] THERMALLY INSULATING GLAZING

[75] Inventors: Anton Dietrich, Rodenbach; Klaus Hartig, Ronneburg; Werner Lenz, Langenselbod; Michael Scherer, Rodenbach, all of Fed. Rep. of Germany

[73] Assignee: Leybold-Heraeus GmbH, Cologne, Fed. Rep. of Germany

[21] Appl. No.: 584,639

[22] Filed: Feb. 29, 1984

[30] Foreign Application Priority Data

Mar. 4, 1983 [DE] Fed. Rep. of Germany ....... 3307661

[51] Int. Cl.$^4$ .............................................. C23C 15/00
[52] U.S. Cl. ............................ 204/192 P; 204/192 R; 204/192 D; 204/192 SP; 204/192 C; 350/1.7; 427/160; 427/166
[58] Field of Search ........... 204/192 D, 192 P, 192 R, 204/192 SP, 192 C

[56] References Cited

U.S. PATENT DOCUMENTS

| 4,302,498 | 11/1981 | Faith | 204/192 P |
| 4,310,568 | 1/1982 | Howard et al. | 204/192 P |
| 4,337,990 | 7/1982 | Fan et al. | 204/192 P |
| 4,413,877 | 11/1983 | Suzuki et al. | 350/1.7 |
| 4,428,808 | 1/1984 | Weinert | 204/192 R |

FOREIGN PATENT DOCUMENTS 2407363 8/1974 Fed. Rep. of Germany ... 204/192 P

OTHER PUBLICATIONS

Lampert, Solar Energy Materials, 6 (1981), pp. 10–15.

Primary Examiner—Arthur P. Demers
Attorney, Agent, or Firm—Felfe & Lynch

[57] ABSTRACT

A method of producing glass sheets having good transmission behavior in the visible spectrum range and having good reflection behavior as regards heat radiation. A transparent substrate S is coated by cathodic atomization with, successively, a first oxide layer 1 comprising indium oxide, tin oxide or mixtures thereof, a layer 2 consisting of silver in a thickness of 5 to 50 n, a metallic layer 3 selected from aluminium, titanium, tantalum, chromium, manganese and zirconium in a thickness ranging from 1 to 5 nm and applied directly to the silver layer 2 for the purpose of maintaining the condition thereof, and a final protective oxide layer 4 of indium oxide, tin oxide or mixtures thereof.

6 Claims, 5 Drawing Figures

THERMALLY INSULATING GLAZING

BACKGROUND OF THE INVENTION

The invention concerns a method of producing thermally insulating glass sheets which have a good transmission behavior in the visible spectrum range and good reflection behavior toward heat radiation. The glass sheets are useful, for example, as window panes or glazing. The invention involves applying coatings (a coating system) to the glass sheets.

Window glazing of the above kind is intended to permit the transmission of the greatest possible amount of visible light and to retain, in the space bounded on the outside by the window concerned, the greatest possible amount of radiated heat. This arrangement is intended, particularly in winter, to prevent expensive thermal energy from becoming dissipated. In this connection it has to be borne in mind that an uncoated window pane acts like an opening for heat radiation. Known coating systems of this kind are therefore referred to in international parlance as "low E coatings".

De-AS No. 22 21 472 discloses a method of producing a thermally insulating glazing means by the vacuum deposition of silver and aluminium, among other materials, wherein the silver coating is intended to effect a reduction in the transmission coefficient of as much as 25% to 75% and wherein the aluminium coating intended to bring about a further reduction in the transmission coefficient of from 20% to 50%. Coatings of this kind do not have a good transmission behavior in the visible range, and the thicknesses of the silver coating and the aluminium coating are substantially greater than 50 nm. Thus, the metallic layers are pronouncedly "thick". Because use is made of vapour deposition, the aluminium layer is not altered appreciably during the production process even when an oxide layer is subsequently applied, by vapour-deposition, to the silver-aluminium coating system.

DE-OS No. 24 07 363 discloses a method of producing a semi-reflecting glazing which likewise does not exhibit good transmission behavior in the visible spectrum range. During the process of manufacture, metal coatings, including silver, are deposited directly on the sheet of glass, and an oxide coating, forming a protective layer, is then deposited by cathodic atomization on, for example, the silver coating. It has been found, however, that a sufficiently good transmission behavior cannot be achieved by a method of this kind, the expression "sufficiently good transmission behavior" being understood as meaning a maximum in the measured transmission curve of at least 80% and preferably at least 85%.

In connection with the production of heat-insulating window panes, it is known from DE-OS No. 31 30 857 to embed a layer of silver between two layers of oxide which consists of one of the materials lead oxide, antimony oxide and tellurium oxide or a mixture or alloy of these materials. All of the coatings are intended to be applied by cathodic atomization. It has been found, however, that a coating system of this kind is likewise incapable of providing the required good transmission behavior in the visible spectrum range. It was observed, for example, that with a satisfactorily good reflection behavior in the thermal radiation range, the transmission behavior deteriorated because of a corresponding absorption, and light dispersion could also be observed when the consumption of silver per unit of area was high.

The coating layer that is actually effective for good heat reflection is the silver coating layer. This should be as thin as possible and applied in such a way that its thickness is extremely uniform. Examinations under the electron microscope have shown that this requirement can be fully met by a cathodic atomization process, at least up to the stage at which the first oxide coating and the silver coating are applied. Photographs taken with the electron microscope show, at this stage, a solid silver coating of uniform thickness. The optical properties of such a two-layer system were found to be good in all cases if the effect of the last oxide or protective layer, yet to be applied, is ignored. However, as soon as this last oxide layer was applied by cathodic atomization, an abrupt deterioration of the optical properties was observed, in that the transmission behavior as well as the reflection behavior became notably poorer. Then, in order to improve the reflection behavior for the heat radiation and to return it to the required level, the quantity of silver per unit of area was increased, and this caused further deterioration in the transmission behavior.

Examinations of a coating system of this kind under the electron microscope have led to the finding that the silver coating quite obviously lost its compactness under the effect of the cathodic atomization process during the application to the last layer of oxide, and that it contracted to form isolated drops of silver. This effect was confirmed by measuring the electrical surface resistance of the coating. When the last oxide coating was applied, the surface resistance rose to a multiple of its original value. Even a considerable increase in thickness of the layer of silver did not result in the closing up of the spaces between the "silver islands", but ultimately brought about a dulling of the coating, which is quite obviously attributable to scatter of light. The reason for the break-up of the silver coating can perhaps be attributed to the reactive glow-discharge during the application of the last oxide coating.

One aspect of the present invention involves providing a method of raising the transmission in the visible spectrum range, as well as the reflection in the heat radiation range, of a transparent substrate. In particular, the invention permits an extremely uniform level of transmission and reflection, while using the lowest possible amount of silver per unit of area of the coated window pane. Expressed in other terms, the invention involves preventing, or at least greatly suppressing, the subsequent break-up of the silver coating during the application of the last oxide coating by cathodic atomization.

SUMMARY OF THE INVENTION

According to the invention a transparent substrate is coated, by cathodic atomization, with successive layers comprising a first oxide layer of indium oxide, tin oxide or a mixture thereof, a layer of silver having a thickness of 5 to 15 nm, a metallic intermediate layer, selected from aluminium, titanium, tantalum, chromium, magnesium and zirconium, applied directly to the silver layer in a thickness of between 1 and 5 nm, and a further oxide layer of indium oxide, tin oxide or a mixture thereof.

Examination of this coating system under the electron microscope shows that the compact nature of the silver coating is maintained practically completely. The previously measured resistance of the coating also remains practically unchanged. However, if the intermediate coating consisting of the above-mentioned metals is not applied, the silver coating breaks up again into individual islands, and the measured resistance of the coating rises suddenly when the oxide is applied to the silver by atomization.

When an intermediate coating consisting of one of the above-mentioned metals (or an alloy thereof) is applied, the maximum for transmission in the visible range is found to be at the relatively very high level of 87% at a thickness of 550 nm. The maximum for heat reflection is at the likewise very high level of 93% for a heat radiation range of 8 μm. When the intermediate layer, consisting of the metals selected from the above-mentioned group, was omitted, the maximum for transmission in the visible range dropped to a level of 66% for a thickness of coating of approximately 480 nm, and the infra-red reflection dropped to 60% at 8 μm.

With regard to the resistance of the coating, it is possible, when using an intermediate layer consisting of a metal selected from the above-mentioned group, to record a surface resistance that ranges from 6.7 to 8.2 ohm in a number of tests. As soon as the intermediate layer in accordance with the invention is omitted, the surface resistance rises to an amount that can no longer be measured and is in excess of 10 kilohm. This is another indication of the break-up of the layer of silver when the intermediate layer according to the invention is not present.

Regarding the thickness of the intermediate layer, which is between 1 and 5 nm, it should also be mentioned that no appreciable absorption occurs with a thickness as small as this, so that the metal layer itself does not adversely affect transmission or does not do so to a measurable extent.

Investigations carried out after production of the entire coating system have shown that the initially metallic intermediate layer is more or less fully oxidized after application of the sealing oxide layer, but a small metal residue is always present. It can be assumed that, upon application of the oxide layer, the originally metallic intermediate layer has bound at least that part of the activated oxygen that would otherwise have led to break-up of the layer of silver. Efforts to replace the metallic intermediate layer by an oxide layer of the same metal or metals have been unsuccessful, quite obviously because the layer concerned was already saturated with oxygen.

Among further advantages are a high stability for the process, i.e. on the one hand uniform coatings are produced, and on the other hand these can be reproduced to a large extent in several cycles of the method following one after the other. Furthermore, good mechanical strength and chemical resistance of the coating system is observed. In addition, it is also possible to control the thickness of the layer in a very simple manner by means of a conductivity measurement.

Particular advantage accrues if the oxide layers of indium oxide, tin oxide or mixtures thereof, have a lead oxide content lying within the range of 2 to 15 percent by weight. By means of this addition, the glazing is rendered resistant to chlorine which is dangerous to silver, i.e. the glazing withstands the Common sat spray test of Specification SS DIN No. 500 21, usually applied for acceptance purposes, for a considerably longer period than do comparable products not containing lead oxide. Glazing with the lead oxide addition also offers lengthier resistance than comparable products in atmospheres containing industrial waste gases.

Between 0.001% and 1.0% nickel may be added to the atomization target for the production of the silver layer. It has been found that the uniformity of the silver layer is further increased by a very small addition of nickel of this kind, perhaps due to the fact that the nickel atoms act as condensation nuclei for the layer of silver.

Coating systems that have been tried out in practice are detailed in the following Table, together with their layer thicknesses and the advantageous ranges over which the individual layer thicknesses can be varied:

| Layer No. | Material of Layer | Thickness of layer (nm) | Advantageous Range (nm) |
|---|---|---|---|
| 1. | $SnO_2$, $In_2O_3$ | 40 | 30–50 |
| 2. | Ag | 10 | 5–15 |
| 3. | Al, Ti, Ta, Cr, Mn, Zr | 2 | 1–5 |
| 4. | $SnO_2$, $In_2O_3$ | 40 | 30–50 |

Embodiments of the glazing according to the invention will now be describe in greater detail by reference to the accompanying drawings and to the following Examples illustrating the method.

DETAILED DESCRIPTION OF THE INVENTION

Figure 1:
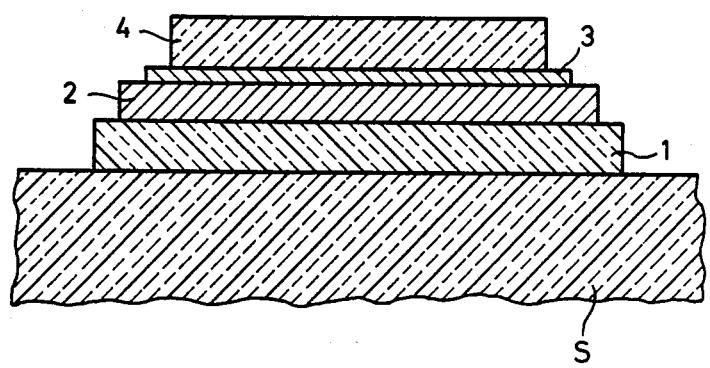
FIG. 1 is a cross-section through a glazing according to the invention.

FIG. 1 shows a substrate S which comprises a pane of mineral glass. On the substrate is a first oxide layer 1 which has a thickness of 40 nm and consists of indium oxide, tin oxide or mixtures thereof. Applied to this layer is a second layer 2 consisting of silver and having a thickness of 10 nm. Applied to this layer was layer 3 (the intermediate layer, as it is called) having a thickness of 2 nm and originally consisting of a metal selected from aluminium, titanium, tantalum, chromium, manganese and zirconium. Applied to this third layer is a fourth layer 4 consisting of one or more of the oxides used for the first layer 1. All of the layers are applied by means of a cathodic atomization process which, taken on its own, forms part of the prior art. The layer 3 is substantially fully oxidized by the cathodic atomization process; it does not, however, constitute a pure oxide of the metal or metals concerned.

Figure 2:
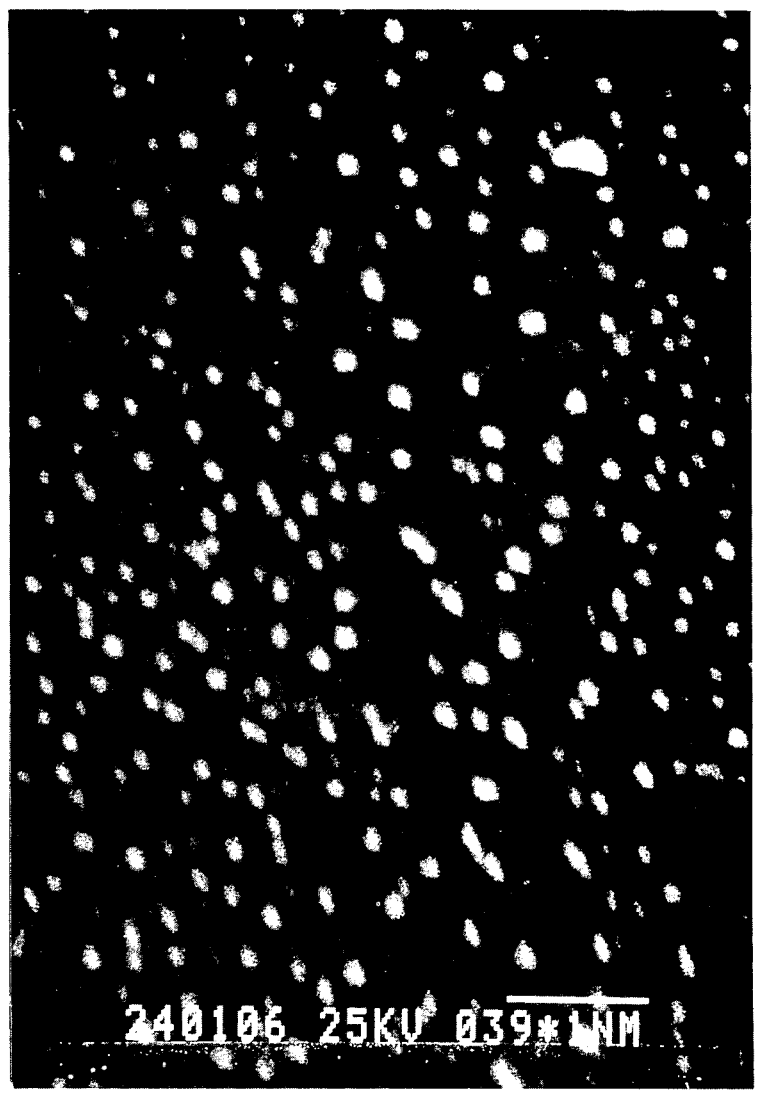
FIG. 2 is for comparison purposes, an electron-microscope photograph of a coating system forming part of the prior art.

FIG. 2 is a photograph, taken by means of an electron microscope, of a previously known coating system, i.e.

a system that does not include the intermediate layer 3 shown in FIG. 1. The bright flecks represent isolated particles of silver, and it can be clearly seen that the photographed section is saturated with a large number of such "islands".

Figure 3:
FIG. 3 is an electron-microscope photograph of a coating system according to the invention.

FIG. 3 is a similar photograph on the same scale but obtained from a coating system in accordance with the invention and as illustrated in FIG. 1. It can be clearly seen that the number of flecks is considerably smaller and that the flecks that are present are considerably less pronounced. This condition approaches the ideal of an absolutely uniform layer of silver, which is delimited also in the microscopic range of planar-parallel faces.

Figure 4:
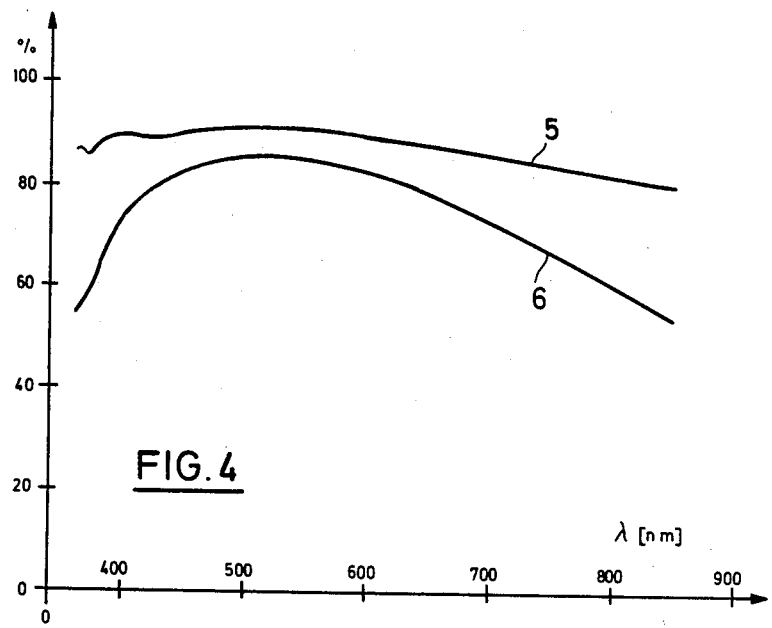
FIG. 4 shows transmission curves for an uncoated window pane and for a pane having the tin oxide/silver-/aluminium/tin oxide coating system.

FIG. 4 shows two transmission curves in the wavelength range extending from approximately 380 to 850 nm. The upper curve 5 shows the transmission behaviour of an uncoated pane of glass, whereas the lower curve 6 indicates the transmission behaviour of a coating system consisting of a glass substrate/tin/oxide/silver/aluminium/ tin oxide. It can be clearly seen that the peak of the transmission curve is approximately 85% in the zone around the wavelength of 550 nm.

Figure 5:
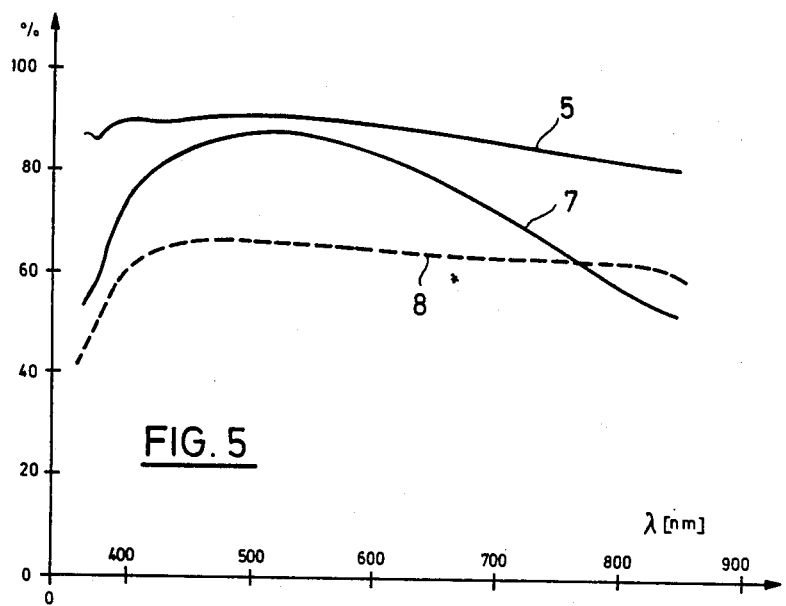
FIG. 5 shows transmission curves for an uncoated window pane, for a coating system comprising indium-tin-lead oxide/silver/aluminium/indium-tin-lead oxide, and (for comparison purposes) for a coating system comprising indium-lead-tin-oxide/silver/indium-lead-tin oxide.

FIG. 5 also shows transmission curves, and here again, curve 5 relates to an uncoated pane of glass. Curve 7 shows the transmission for a coating system comprising a glass substrate/indium-tin-lead oxide/silver/aluminium/ indium-tin-lead oxide. The oxide layers concerned were produced by the reactive atomization of a metallic target consisting of 85% indium, 10% lead and 5% tin. The curve shows that the transmission maximum lies in a zone around approximately 520 nm and at 87%.

The broken-line curve 8 shows the transmission behaviour when the metallic intermediate layer 3 (FIG. 1) is omitted i.e. prior art coating system shown in FIG. 2. It can be clearly seen that transmission is practically unchanged over a wide range and that even at the point of the maximum occurring at a wavelength of approximately 480 nm, transmission does not exceed 66%, i.e. more than one third of the daylight would be "swallowed" by a window pane of this kind.

EXAMPLE 1

Targets of pure tin, silver, aluminum and tin again were atomized in succession in a cathodic atomization installation of the A 900 H type (manufacturers: Messrs. Leybold-Heraeus GmbH of Hanau, German Federal Republic). The substrates were panes of glass, having dimensions of 40 cm×40 cm, which were moved relative to the targets or to the cathodes. The tin was atomized in a reactive atmosphere, so that layers of tin oxide were deposited. The silver and aluminium were atomized in a neutral atmosphere. The thicknesses of the layers corresponded to the values given in the above Table.

The transmission behaviour corresponded to curve 6 of FIG. 4. The surface resistance $R_s$ was 8.2 ohm. The electron-microscope picture of this coating system is shown in FIG. 3.

EXAMPLE 2 TO 6

The test used in Example 1 was repeated, but with the difference that the aluminium for the layer 3 (FIG. 1) was in turn replaced by targets consisting of titanium, tantallum, chromium, manganese and zirconium. In all cases, coatings with practically corresponding optical curves, conforming to curve 6 in FIG. 4, were obtained. The electron-microscope pictures also corresponded substantially to that reproduced in FIG. 3.

EXAMPLE 7

Example 1 was repeated but with the difference that the pure tin target was replaced by a metallic target having the following composition: 85% indium; 10% lead; 5% tin. The thicknesses of the layers were again the same as those given in the above-mentioned Table. The transmission behaviour is illustrated by curve 7 of FIG. 5. The surface resistance $R_s$ was 6.7 ohm.

Examination using the salt-water spray test in accordance with Specification SS DIN 50021 indicated a very high resistivity. The results of the tests indicated that the material remained stable for several months even in a corrosive industrial atmosphere.

What is claimed is:

1. A method of producing glass sheets having good transmission behavior in the visible spectrum range and having good reflection behavior with respect to heat radiation, which comprises coating a transparent substrate, by cathodic atomization, with successive layers comprising
    (a) a first oxide layer of indium oxide, tin oxide or a mixture thereof,
    (b) a layer of silver having a thickness of 5 to 15 nm,
    (c) a metallic intermediate layer, selected from aluminium, titanium, tantalum, chromium, magnesium and zirconium, applied directly to the silver layer in a thickness of between 1 and 5 nm, and
    (d) a further oxide layer of indium oxide, tin oxide or a mixture thereof.

2. A method according to claim 1, wherein the oxide layers are applied in a reactive atmosphere and the metallic layers are applied in a neutral atmosphere.

3. A method according to claim 1, wherein the oxide layers are produced with lead oxide contents of between 2% and 15% by weight.

4. A method according to claim 3, wherein an alloy containing 80% to 90% indium, 5% to 10% tin and 2% to 15% lead is used as the atomization target for producing the oxide layers.

5. A method according to claim 3, wherein an alloy containing 85% to 98% tin and 2% to 15% lead is used as the atomization target for producing the oxide layers.

6. A method according to claim 1, wherein the atomization targets for producing the silver layer contain between 0.001% and 1% nickel.

* * * * *